(12) United States Patent
Sturcken

(10) Patent No.: US 6,734,538 B1
(45) Date of Patent: May 11, 2004

(54) ARTICLE COMPRISING A MULTI-LAYER ELECTRONIC PACKAGE AND METHOD THEREFOR

(75) Inventor: Keith K. Sturcken, Nokesville, VA (US)

(73) Assignee: BAE Systems Information & Electronic Systems Integration, Inc., Nashua, NH (US)

( * ) Notice: Subject to any disclaimer, the term of this patent is extended or adjusted under 35 U.S.C. 154(b) by 24 days.

(21) Appl. No.: 09/834,022

(22) Filed: Apr. 12, 2001

(51) Int. Cl.[7] ............................................. H01L 23/02
(52) U.S. Cl. ........................................ 257/686; 438/455
(58) Field of Search ........................... 257/686; 438/455

(56) References Cited

U.S. PATENT DOCUMENTS

| 4,706,166 | A |   | 11/1987 | Go |         |
|-----------|---|---|---------|----|---------|
| 5,327,327 | A | * | 7/1994  | Frew et al. ................. | 361/784 |
| 5,602,420 | A |   | 2/1997  | Ogata et al. |  |
| 5,706,178 | A |   | 1/1998  | Barrow |  |
| 5,786,628 | A | * | 7/1998  | Beilstein, Jr. et al. ...... | 257/684 |
| 5,894,411 | A |   | 4/1999  | Embo et al. |  |
| 5,952,725 | A | * | 9/1999  | Ball ........................... | 257/777 |
| 5,998,864 | A |   | 12/1999 | Khandros et al. |  |
| 6,020,629 | A |   | 2/2000  | Farnworth et al. |  |
| 6,033,931 | A |   | 3/2000  | Hoffman et al. |  |
| 6,051,878 | A |   | 4/2000  | Akram et al. |  |
| 6,072,233 | A |   | 6/2000  | Corisis et al. |  |
| 6,121,676 | A |   | 9/2000  | Solberg |  |
| 6,122,187 | A |   | 9/2000  | Ahn et al. |  |
| RE36,916  | E |   | 10/2000 | Moshayedi |  |
| 6,133,626 | A |   | 10/2000 | Hawke et al. |  |
| 6,137,162 | A |   | 10/2000 | Park et al. |  |
| 6,137,163 | A |   | 10/2000 | Kim et al. |  |
| 6,153,929 | A |   | 11/2000 | Moden et al. |  |
| 6,380,616 | B1 | * | 4/2002 | Tutsch et al. ............... | 257/686 |
| 6,418,033 | B1 | * | 7/2002 | Rinne ......................... | 361/784 |

* cited by examiner

Primary Examiner—John F. Niebling
Assistant Examiner—Christopher Lattin
(74) Attorney, Agent, or Firm—DeMont & Breyer, LLC

(57) ABSTRACT

A high-density electronics package comprises a chip-stack having a plurality of ICs. Oblong-shaped bumps comprising an electrically-conductive bonding material are disposed along one side of each IC in the chip-stack. The one side of each IC bearing the bumps is aligned with the bump-bearing side of all other ICs in the chip-stack. A portion of each oblong-shaped bump extends beyond the edge of its host IC. This portion of each bump is available to electrically and mechanically connect the chip stack to the next packaging layer, such as a printed circuit board.

10 Claims, 6 Drawing Sheets

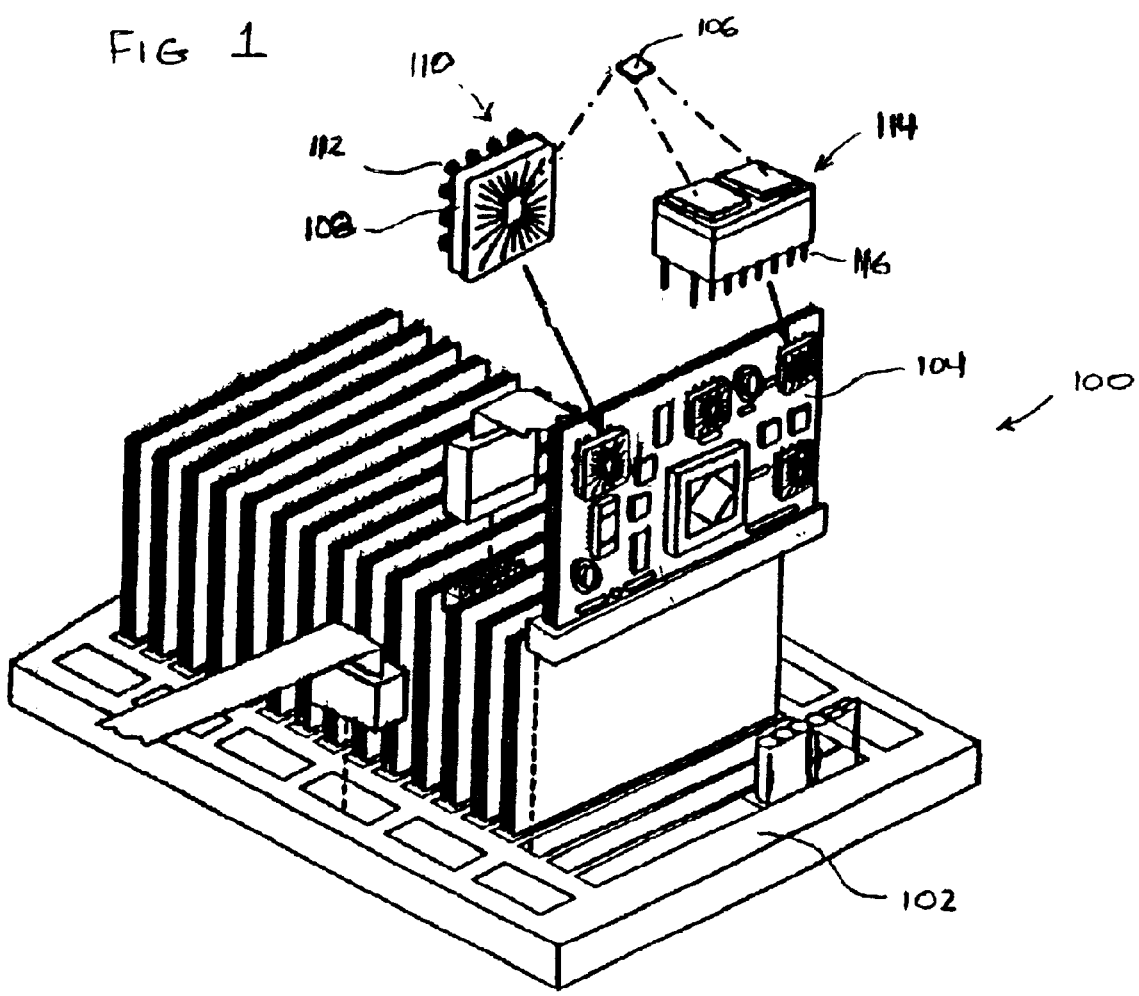

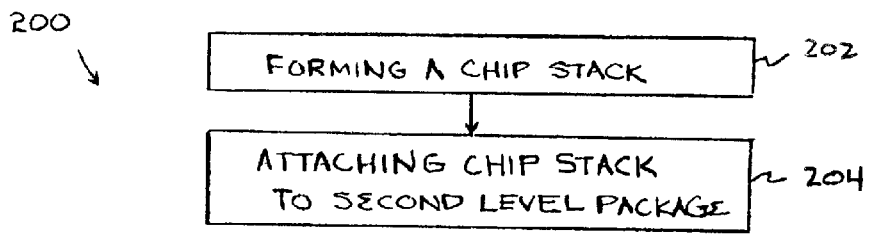
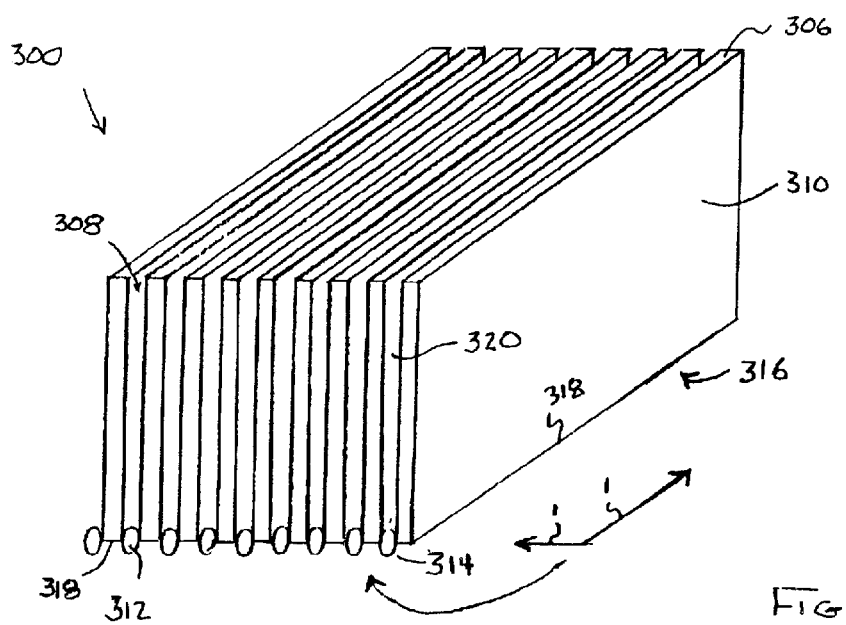
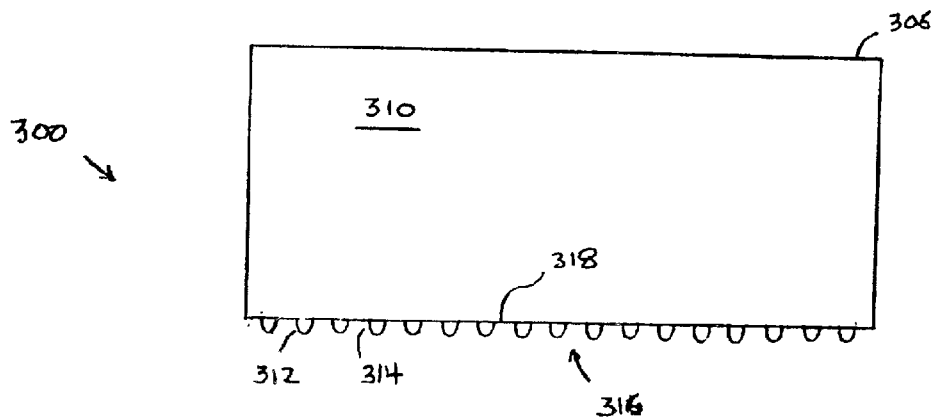

ARTICLE COMPRISING A MULTI-LAYER ELECTRONIC PACKAGE AND METHOD THEREFOR

FIELD OF THE INVENTION

This invention relates to high-density electronics packaging. More particularly, the present invention relates to increasing the packing density of integrated circuit chips.

BACKGROUND OF THE INVENTION

The science of electronics packaging addresses the manner in which one or more integrated circuits, hereinafter "ICs," (defined later in this specification) are packaged efficiently and reliably. Packaging-related issues play a significant role in determining the number of ICs that can be placed in an electronics package and the performance of the package.

Electronics packages have a hierarchical structure wherein the smallest devices (i.e., ICs) are incorporated into a larger platform, the larger platform is incorporated into a still larger assemblage, and so forth. This hierarchical structure, which creates packaging efficiencies, is illustrated in FIG. 1, which depicts conventional electronics package 100.

Electronics package 100 consists of a third level electronics package in the form of motherboard 102 that receives a plurality of cards or printed circuit boards ("PCB") 104. Each card 104, which is a second level electronics package, includes a variety of IC chips, which are first level packages. IC chips, such as chip 106, are attached to the card in any of a variety of ways. For example, an IC chip can be attached to substrate 108 forming single-chip module 110 (a first level electronics package) and then attached to card 104, such as by solder bumps 112. Alternatively, an IC chip can be packaged with other IC chips in the form of a multi-chip module 114 (a first level electronics package) and then attached, by pins 116 for example, to card 104. There are many different packaging technologies, as is required, or at least preferred, for handling the variety of semiconductor IC devices (e.g., application-specific ICs, microprocessors, cache memory and main memory) as function, primarily, of IC pin count. See, Lau, *Low Cost Flip Chip Technologies for DCA, WLCSP, and PBGA Assemblies*, Chapt. 1, (McGraw-Hill, ® 2000).

In electronics packaging, there is a constant drive to improve density. That is, the industry strives for more IC chips per unit volume and more input/output ("I/O") connections per unit area of circuit board space. In one approach, electronics packaging density is increased at the first packaging level by creating a "chip-stack" wherein a plurality of IC chips are directly attached to one another. A high density interconnect scheme typically accompanies the chip-stack, wherein a large number of I/O connections are provided across a relatively small area. The prior art is replete with chip stack packages; a brief survey of such art follows.

U.S. Pat. No. 4,706,166 discloses a horizontal stack of IC chips. All electrical leads of the ICs are on a single access plane that is defined by one side of the stack. Bonding pads are formed on the access plane, and bonding bumps are formed on the bonding pads. Furthermore, strips are formed on the access plane, and bonding bumps are formed on the strips. A substrate has a pattern of metallic conductors that match the pattern on the access plane. The one side of the stack is then attached to a substrate by bonding the bumps that are on the stack to bumps that are disposed on the conductors residing on the substrate.

In U.S. Pat. No. 5,602,420, plural non-packaged semiconductor elements having peripheral bond pads are spacedly stacked in a vertical direction. Corresponding bond pads are soldered with meltable balls to one of a plurality of leads that are perpendicular to the superconductor elements.

U.S. Pat. No. 5,998,864 discloses a vertical stack of bare semiconductor devices. The semiconductor devices are offset in at least one direction so that a portion of each of the semiconductor device is exposed. Conductors attached to the exposed portion of each semiconductor device make electrical contact with a substrate.

U.S. Pat. No. 6,020,629 discloses a package comprising a vertical stack of semiconductor devices. The package includes a plurality of separate substrates each having a semiconductor die mounted thereon. Each substrate has matching patterns of external contacts and contact pads that are formed on opposing sides of the substrate. All die in the package are interconnected through inter-level conductors.

U.S. Pat. No. 6,033,931 discloses a horizontal stack of chips. Electrical connection on each chip is rerouted to one side of the chip, wherein a solder ball is ultimately attached at that point. A three-layer dielectric film consisting, in one embodiment, of polyimide and acrylic, is sandwiched between a major surface of adjacent chips thereby acting as spacers. Each sandwiched dielectric film is recessed relative to the surrounding chips so that the edge side of each chip extends beyond the edge of each dielectric film, forming a castellated profile. Solder balls are attached to the extended side edges, and the solder balls are then attached to a substrate.

In U.S. Pat. No. 6,051,878, a vertical multi-substrate stack is disclosed. The substrates are stacked atop one another using electrically conductive balls or column-like structures. Semiconductor die are connected to one or both sides of each stacked substrate.

U.S. Pat. No. 6,072,233 discloses a vertical stack of fine ball grid array ("FBGA") packages. Each FBGA package includes a substrate that has conductive traces formed on the bottom and top surfaces thereof. The FBGA package further includes an IC that is attached to a die pad that is formed on the top surface of the substrate. The IC has a plurality of bond pads that are disposed over an aperture that is formed in the die pad and the substrate. Wire bonds pass through the aperture and form an electrical connection between the bond pads on the IC and terminal pads on the bottom surface of the substrate. Solder balls that are attached to the conductive traces on the substrate of a first FBGA package are attached to the conductive traces on the substrate of a second FBA package, and so forth, creating a stack of FBGA packages.

U.S. Pat. No. 6,121,676 discloses a vertical stack of ICs. ICs are attached to a flexible substrate, and the substrate is then bent to form a serpentine configuration. In this configuration, the ICs lie one above the other in the form of a vertical stack. Solder balls are used to attach the substrate to the next packaging layer.

In Re. 36,916, a multi-chip memory module includes a plurality of stacked ICs that are disposed between and interconnected by opposing sideboards. The sideboards are circuit boards having a pattern of interconnected vias that receive the pins of the stacked ICs. The pins of the lowermost IC are also attached to a substrate, such as a main circuit board.

U.S. Pat. No. 6,153,929 discloses a vertical stack of ICs. Major surfaces of adjacent ICs are bonded together. Outer leads on opposed side edges of each IC contact flexible conductive buses that terminate in bus ends that are joinable to a PCB.

These stacked-chip packages, and the assembly processes required to fabricate them, are typically quite complex. In fact, new technologies must often be developed to support such designs. As a consequence, the packages are usually high in cost, sometimes of questionable reliability, and are often produced at low yields. The art would benefit, therefore, from a high density electronics package that avoids the drawbacks of the prior art.

SUMMARY OF THE INVENTION

The present invention is a high-density electronics package, and a method for making such a package, that avoids much of the complexity of the prior art.

High-density electronics packages described herein compromise a chip-stack that has a plurality ICs that are joined together at opposing major surfaces. A plurality of oblong-shaped "bumps" comprising an electrically-conductive bonding material are disposed in a one-dimensional array along one side of each IC in the chip-slack. The one side of each IC bearing the bumps is aligned with the bump-bearing side of all other ICs in the chip-stack. When so aligned, the one-dimensional array of bumps on each IC collectively defines a two-dimensional array of such bumps.

A portion of each oblong-shaped bump extends beyond the edge of its host IC. This portion of each bump is available to electrically and mechanically connect the chip stack to the next packaging layer (i.e., a second level electronics package), typically a printed circuit board. In fact, some high-density electronics packages in accordance with the illustrative embodiment of the present invention comprise a chip-stack that is attached, in a horizontal disposition, to a second level electronics package. In some of such variations, the second level electronics package has a two dimensional array of I/O pads that are appropriately sized for receiving the exposed array of bumps. After aligning and contacting the bumps of the chip-stack with the I/O pads of the second level package, the bumps are melted and then cooled in a "re-flow" process that results in the formation of a bond between each bump and its corresponding I/O pad. The bond mechanically and electrically connects the ICs to the second level package.

A method for forming a high-density electronics package in accordance with the illustrative embodiment of the present invention comprises:

forming oblong-shaped-bumps near an edge of a first side of an IC, wherein a portion of each of the bumps extends beyond a perimeter of the active area of the IC and into the kerf along that side;

removing at least a portion of the kerf along the bump-bearing side, thereby defining a foreshortened side of the IC, wherein a portion of each of the bumps extends beyond an edge of the foreshortened side;

aligning the edge of the foreshortened side of the IC with the edge of a second, similarly prepared IC; and attaching the ICs at major surfaces thereof such that a portion of each bump extends beyond the edge of the shortened side of each of the ICs and the balance of each bump is sandwiched between the ICs.

BRIEF DESCRIPTION OF THE DRAWINGS

FIG. 1 depicts a conventional electronics package.

FIG. 2 depicts a method in accordance with the illustrative embodiment of the present invention.

FIG. 3 depicts a perspective view of a chip-stack in accordance with the illustrative embodiment of the present invention.

FIG. 4 depicts a front view of the chip-stack of FIG. 3.

DETAILED DESCRIPTION OF THE ILLUSTRATIVE EMBODIMENT

Figure 5:
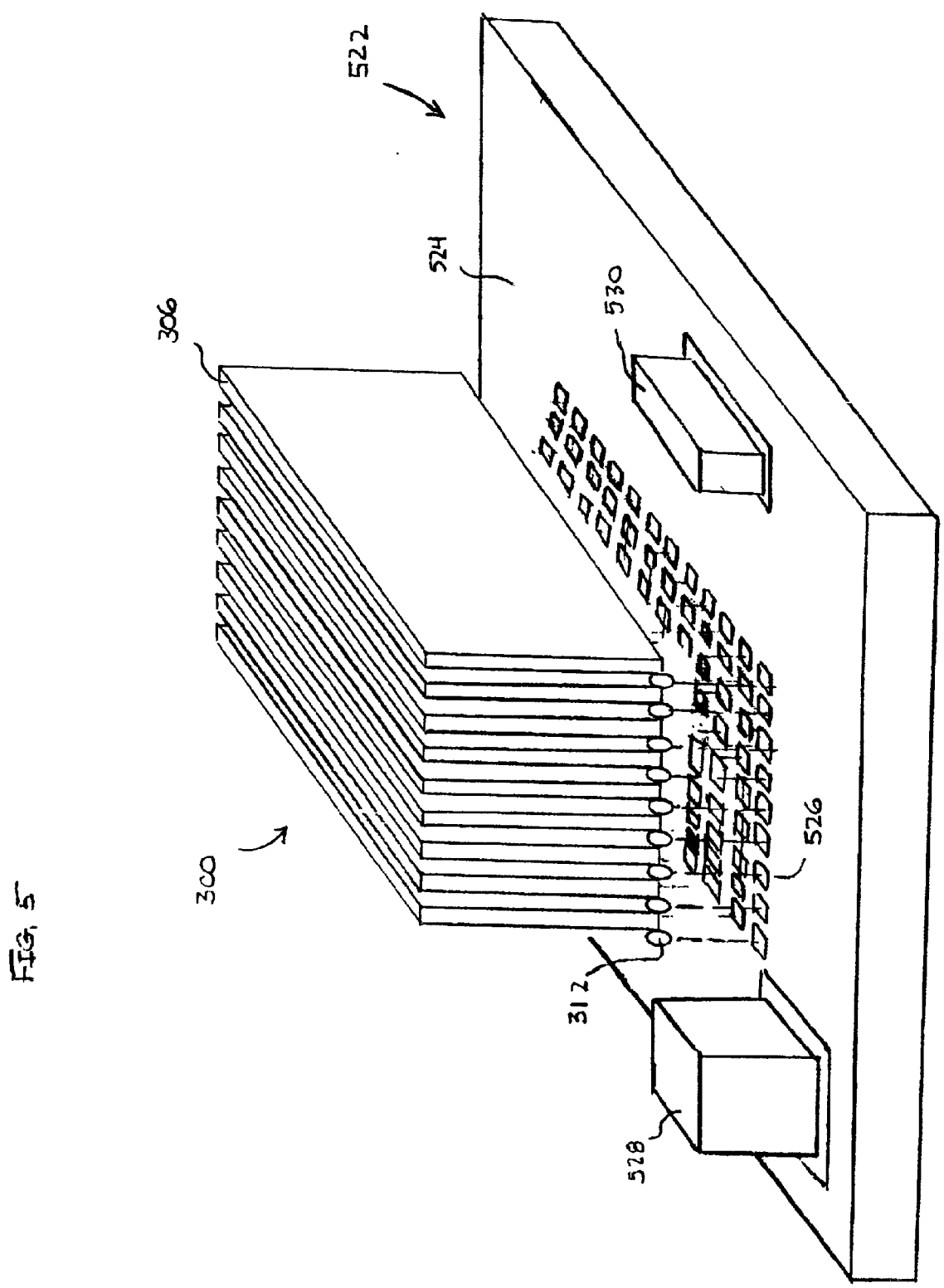
FIG. 5 depicts the chip-stack of FIG. 3 being attached to a second level electronics package.

The terms listed below are given the following specific definitions for the purposes of this specification.

Integrated Circuit or IC refers to a microcircuit that is formed from passive and active electrical components that are interconnected on or within a single semiconductor substrate. Microcircuits are commonly encapsulated within ceramic, plastic or epoxy for protection, and, to facilitate physical and electrical connection to the next packaging layer, have multiple external terminals (e.g., pins, etc.). The full package, including the microcircuit(s), encapsulating material and terminals, is commonly referred to as a "chip" or "IC chip." Notwithstanding any differences in usage, the terms "Integrated Circuit," "IC," "chip" and "IC chip" are used interchangeably herein.

First Level Electronics Package refers an IC, or a module comprising one or more ICs that are bonded to a substrate (see, e.g., FIG. 1: single-chip module 108, multi-chip module 114).

Second Level Electronics Package refers a printed circuit board or card comprising one or more first level electronics packages (see, e.g., FIG. 1).

Solder comprises any of a wide variety of metal compositions (or a single metal) used as an electrically conductive bonding material. Solder suitable for use in conjunction with the electronics packages described herein (and, more generally, for any application) will possess an acceptable measure, known to those skilled in the art, of certain characteristics that are indicative of a reliable bond. An acceptable solder possesses satisfactory electrical characteristics, of which electrical resistivity is a gauge, and satisfactory mechanical characteristics, of which wetability and micro-hardness are gauges. Also important are the melting characteristics of the solder, including extrapolated onset melting temperature, peak melting temperature and observed onset melting temperature. Illustrative solder compositions include, without limitation, various concentrations of lead-tin, tin-silver, tin-bismuth, tin-antimony, tin-bismuth-indium, etc.

Bump, Solder Bump, Solder Ball refers to a small deposit of electrically-conducting bonding material, typically comprising one or more metals. The electrically-conducting bonding material serves as an electrical and mechanical interconnect between surfaces (e.g., a chip to a substrate, a chip module to a printed circuit board, etc.). Such bumps are commonly used for "flip chip" bonding. Metal and metal compositions used for the bumps include, without limitation, solder compositions, gold, copper, aluminum, nickel, nickel-gold and the like.

Kerf refers to an inactive area of an IC located at the margin or periphery thereof.

Oblong means a shape that deviates from a square, circular or spherical form by elongation in one direction. Elliptical, oval and rectangular shapes are oblong.

Major Surface and Minor Surface refer, respectively, to relatively larger and relatively smaller surfaces of an object. For example, an IC is considered to have two major surfaces and four minor surfaces. The major surfaces have an area that is defined by the length and width of the IC, the minor surfaces have an area that is defined by the thickness of the IC and the length or width of the IC.

Plurality, and its inflectives (e.g., Plural), means two or more.

FIG. 2 depicts method 200 in accordance with the illustrative embodiment of the present invention. In accordance with operation 202 of method 200, a chip-stack, which is a first level electronics package, is formed.

FIG. 3 depicts a perspective view, and FIG. 4 depicts a front view of chip-stack 300. The chip-stack comprises plural ICs 306 that are disposed in spaced and parallel relation to one another. That is, adjacent ICs 306 are separated by space 308, and major surface 310 of any of ICs 306 is parallel to major surface 310 of any other IC 306 in chip stack 300. Chips 306 are attached to one another by adhesive 320, which fills spaces 308.

A plurality of oblong-shaped bumps 312 comprising an electrically-conductive bonding material are disposed in a one-dimensional array along side 316 of each IC 306. Chip-stack 300 is configured so that edge 318 of side 316 of each IC 306 aligns, defining plane 1—1. Portion 314 of each oblong-shaped bump 312 is "exposed," extending beyond edge 318. The one-dimensional array of bumps 312 along side 316 of each IC 306 collectively defines a two-dimensional array of such bumps.

As described in more detail later in this specification, bumps 312 provide electrical and mechanical connection with the next packaging layer (i.e., a second level electronics package). In recognition of this fact, plane 1—1 is referred to as an "access plane" (i.e., providing access to chip stack 300). Further detail regarding the formation of chip stack 300 is provided later in this specification in conjunction with the description of FIGS. 6–13.

Returning to the description of method 200 (FIG. 2), in operation 204, the chip slack (e.g., chip stack 300) is attached to a second level electronics package.

FIG. 5 depicts the attachment of chip stack 300 to second level electronics package 522, in accordance with the illustrative embodiment of the present invention. Second level electronics package 522, which in the illustrative embodiment is a printed circuit board, includes a plurality of input/output ("I/O") pads 526 that are disposed in an array on surface 524. The array of I/O pads 526 is appropriately sized (e.g., proper pitch, etc.) for receiving the array of bumps 312 that extend beyond access plane 1—1 of chip-stack 300. Second level electronics package 522 also includes other circuits and devices, such as, for example, devices 528 and 530. These devices are depicted in FIG. 5 because some such circuits/devices will most likely be present; it being understood, however, that such devices are unrelated to the present invention.

After bumps 312 of chip-stack 300 are aligned with I/O pads 526 and placed in contact therewith, bumps 312 are "re-flowed" by heating them in an oven in known fashion. As the bumps re-flow and cool, a bond is formed between each bump 312 and each I/O pad 526. Tools and techniques for aligning and contacting the bumps with the pads, and reflowing the bumps, are well known to those skilled in the art.

I/O pads 526 advantageously have a nominal amount of solder (or other material consistent with the specific electrically-conductive bonding material that is used to form bumps 312) on them. This promotes satisfactory wetting of bumps 312 to I/O pads 526. The amount of the specific electrically-conductive bonding material added to I/O pads 526 is advantageously not less than about 0.0635 millimeters.

Bonding chip-stack 300 to second level electronics package 522 provides a high-density (i.e., high chip density, high I/O density) electronics package, in accordance with the illustrative embodiment of the present invention. Chip stack 300 has a horizontal orientation on second level electronics package 522 wherein all chips 306 in chip stack 300 are directly disposed on surface 524.

Figure 6:
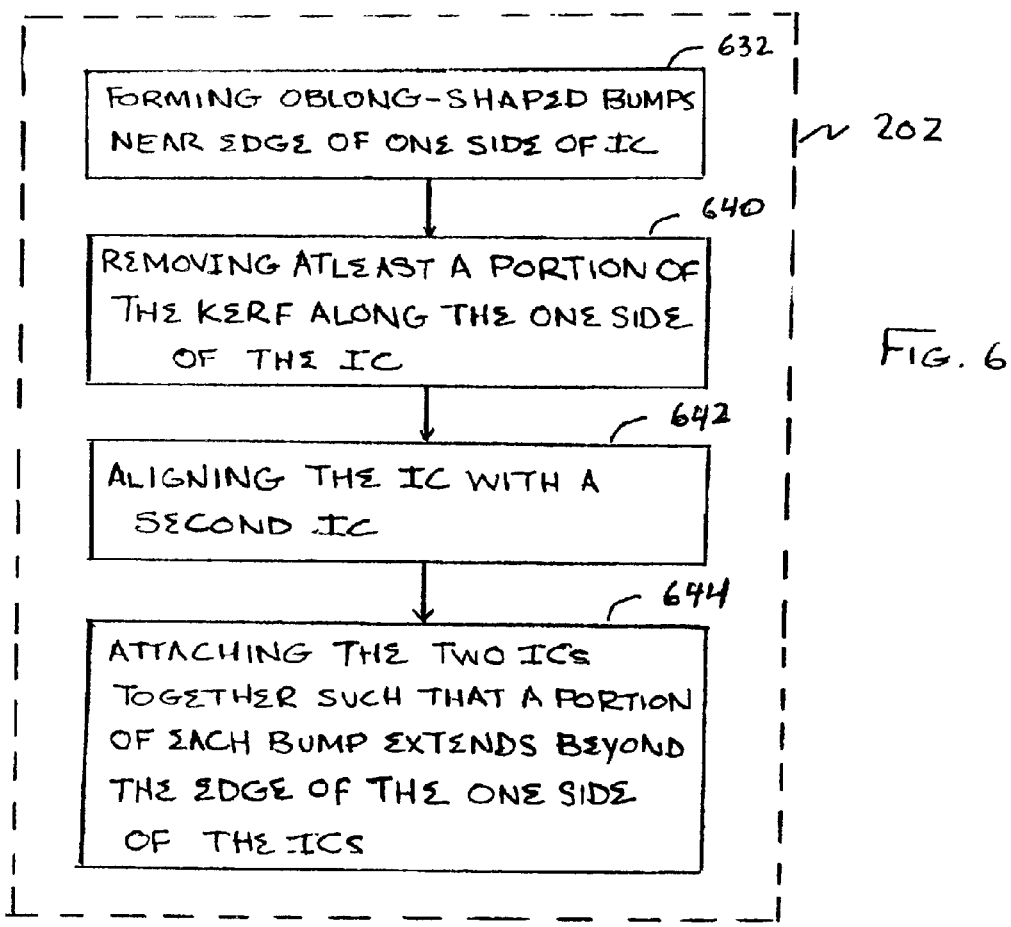
FIG. 6 depicts a method for forming a chip-stack in accordance with the illustrative embodiment of the present invention.

Operation 202 of method 200, forming a chip-stack, is now described in further detail in conjunction with FIGS. 6–13. FIG. 6, in particular, depicts steps in a method in accordance with the illustrative embodiment of the present invention for performing operation 202.

Figure 7:
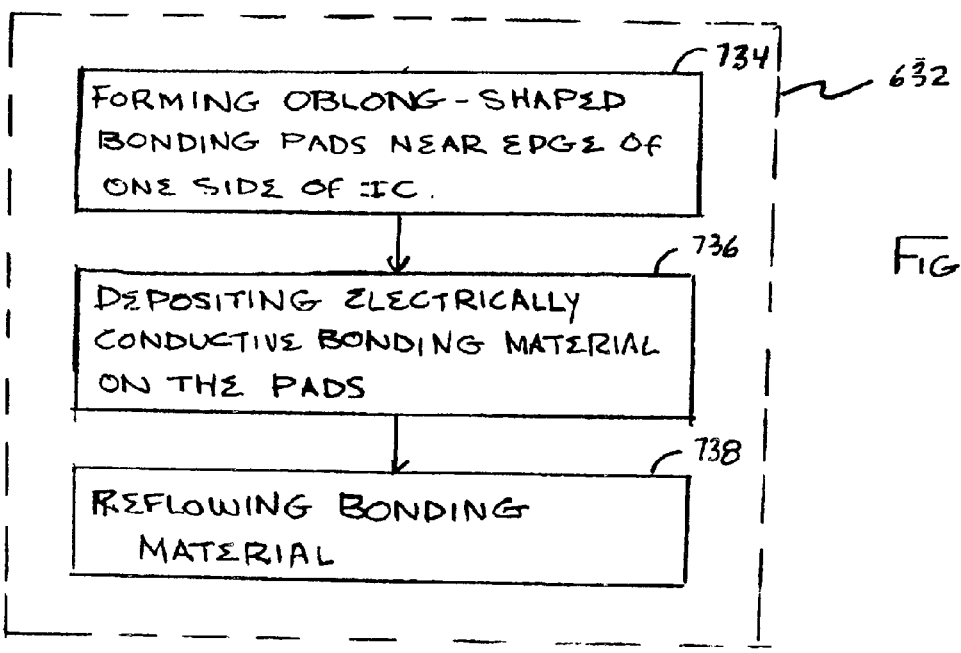
FIG. 7 depicts the operations required for forming an oblong-shaped bump in the method of FIG. 6.

In accordance with operation 632, which, again, is one of the operations required for forming chip-stack 300, oblong-shaped bumps are formed near an edge of one side of an IC. Like operation 202, operation 632 is itself advantageously carried out in several steps, which are shown in FIG. 7. Specifically, operation 632 is advantageously performed by forming oblong-shaped bonding pads near the edge of one side of an IC, in accordance with operation 734. The description proceeds with reference to FIG. 8, which depicts IC 306.

Figure 8:
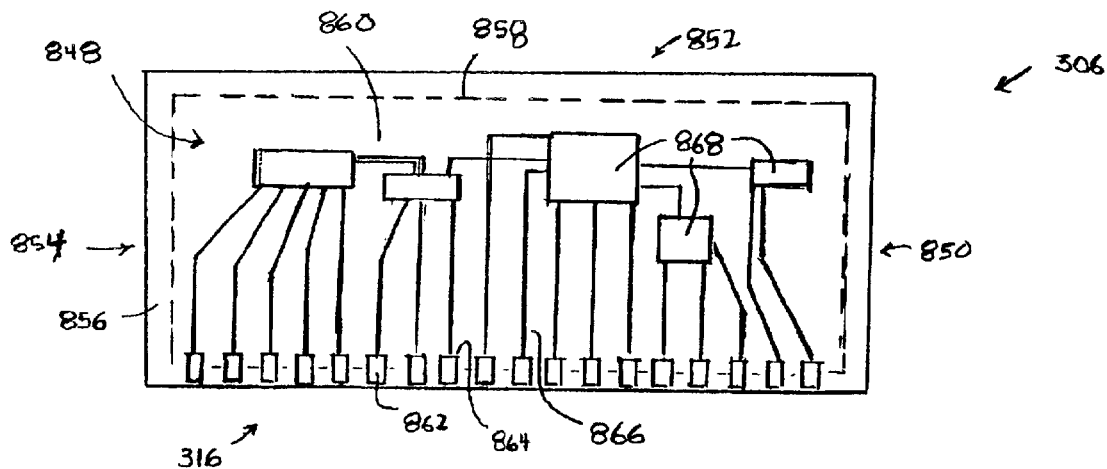
FIG. 8 depicts an IC chip with oblong-shaped bonding pads near an edge of one side of the chip.

FIG. 8 depicts first major surface 848 and four sides 316, 850, 852 and 854 of IC 306. IC 306 includes kerf 856, which is an inactive area of the IC that surrounds active device area 860. The interface between active device area 860 and kerf 856 defines perimeter 858.

Figure 9:
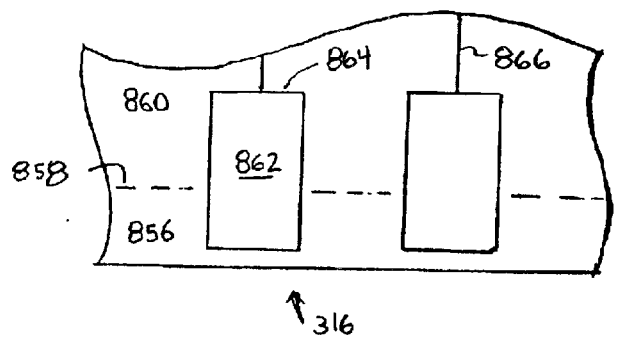
FIG. 9 depicts an enlargement of FIG. 8 showing detail of the oblong-shaped bonding pads.

As previously described, operation 734 requires forming oblong-shaped bonding pads near the edge of one side of an IC. In illustrative IC 306, for example, rectangular bonding pads 862 are disposed near the edge of side 316. More particularly, as depicted in FIG. 9, each bonding pad 862 is disposed partially in active device area 860 and partially in kerf 856 across perimeter 858 along side 316. Advantageously, perimeter 858 bisects each bonding pad 862 such that about one-half of each bonding pad is disposed in active device area 860 and one-half is disposed in kerf 856. Other allocations are acceptable; however, it is preferable for at least one-half of each bonding pad to be disposed in active device area 860. Furthermore, at least some portion must be disposed in kerf 856. When used to refer to the location of bonding pads 862 or oblong-shaped bumps 312, the phrase "near an edge of an IC" (or like construction) means, for the purposes of this specification, that at least some portion of each bonding pad or bump is disposed in kerf 856 (or the region that was the kerf before its removal). Trailing edge 864 of each bonding pad 862 is electrically connected to leads or wire traces 866. Leads 866 place bonding pads 862 in electrical connection with circuitry 868 that is located in active device area 860. The formation of bonding pads 862 is well known in the art and involves depositing metal (e.g., aluminum, etc.) through an appropriately configured mask, typically formed from molybdenum.

It is known to add a variety of additional layers to bonding pads 862, such as, for example, a passivation layer, an adhesion layer, a barrier layer, ball limiting metallurgy ("BLM") or under bump metallurgy ("UBM") and an oxidation barrier. These layers are not depicted in the Figures or otherwise described herein since they are not germane to an understanding of the present invention.

Figure 10:
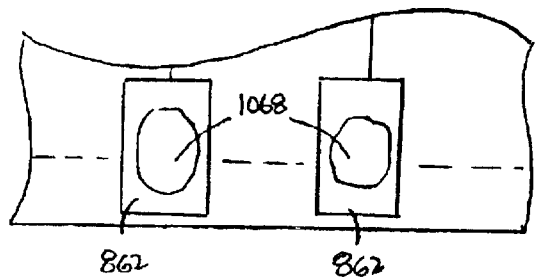
FIG. 10 depicts an electrically-conductive bonding material disposed on the oblong-shaped bonding pads.

After oblong-shaped bonding pads (e.g., bonding pads 862) are formed as per operation 734, electrically-conductive bonding material is deposited on the bonding pads, in accordance with operation 736. There are many ways to deposit the bonding material, typically solder, on bonding pads, including, for example, evaporation through molybdenum masks, electroplating, stencil printing, jet printing, micro-punching (direct and transfer ring), molten injection and micro-ball mounting, to name several. Those skilled in the art can suitably select one of these techniques, which are all conventional, to deposit electrically-conductive bonding material on the bonding pads. FIG. 10 depicts electrically conductive bonding material 1068 disposed on bonding pads 862.

After electrically-conductive bonding material is deposited on the bonding pads, the material is re-flowed in known fashion, in accordance with operation 738. The temperature at which re-flow is conducted is a function of the composition of the bonding material.

Figure 11:
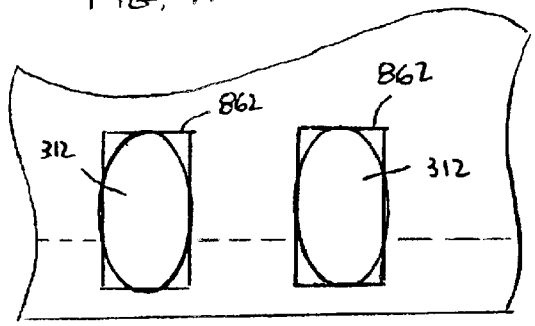
FIG. 11 depicts oblong-shaped bumps formed on the oblong-shaped bonding pads by reflowing the electrically-conductive bonding material.

Typically, bonding pads are square or have a nearly square shape; here, bonding pads 862 have an oblong shape. In accordance with the illustrative embodiment of the present invention, oblong-shaped (e.g., rectangular, elliptical, oval, etc.) bonding pads are used so that, after re-flow, the bumps have an oblong shape. The oblong-shaped pads advantageously have an aspect ratio (i.e., length to width) of about 4:1, although an aspect ratio as low as about 2:1 is acceptable. The oblong shape results from the surface tension between the oblong-shaped bonding pads and the electrically-conductive bonding material. When bonding material is re-flowed on a square bonding pad, the resulting bump has a spherical shape. The resulting oblong-shaped bumps 312 are depicted in FIG. 11.

Returning to FIG. 6 and the description of operation 202 (forming a chip stack), after oblong-shaped bumps are formed (operation 632), at least a portion of the kerf along the side of the IC bearing the bumps is removed, foreshortening that side. A portion the bonding pads are removed as well. The kerf and bonding pads can be removed, for example using HF acid. The result of this operation is depicted in FIG. 12.

Figure 12:
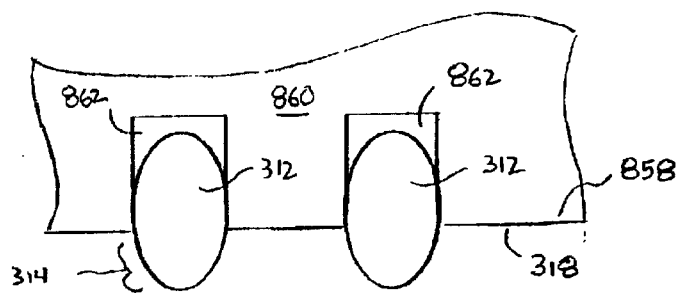
FIG. 12 depicts bumps extending beyond the edge of one side of the IC after at least a portion of the kerf is removed from that side of the chip.
Figure 13:
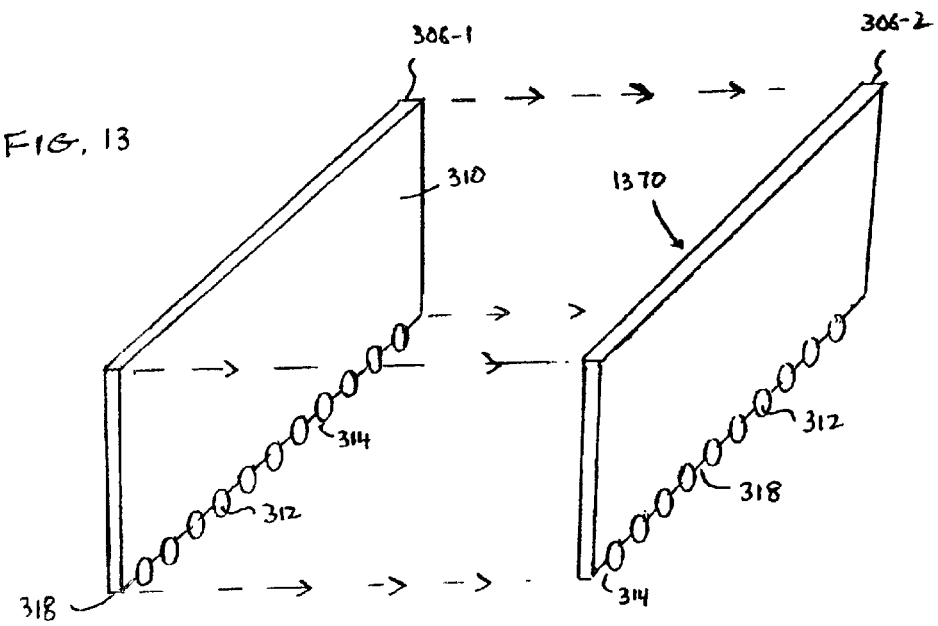
FIG. 13 depicts a first IC having oblong-shaped bumps being attached to a second IC having oblong-shaped bumps in accordance with the illustrative embodiment of the present invention.

In FIG. 12, kerf 856 is completely removed so that what was once perimeter 858 between kerf 856 and active device area 860 is now edge 318 of foreshortened side 316 (see, e.g., FIGS. 3 and 4). Removing at cast a portion of kerf 856 exposes portion 314 of bumps 312; that is, that portion of bumps 312 extends beyond edge 318 (see, also FIG. 3).

Although kerf 856 is completely removed in the illustrative embodiment, in one variation, only a portion of kerf 856 is removed. This variation refers to removing a portion of the width of the kerf, wherein the width of the kerf is defined as the region between the border of the active device area and the edge of the IC. Regardless of whether kerf is fully or only partially removed, the removed portion is removed over the complete length of the side bearing bumps. 312. The phrase "removing at least a portion of the kerf," as used in this specification, means removing a portion of the width of the kerf, and removing that portion for the complete length of the side bearing the bumps.

Referring again to FIG. 6 and the description of operation 202 (forming a chip stack), in operation 642, an IC with bumps 312 that extend beyond edge 318 is aligned with a second, similarly configured IC. That is, the first IC is aligned with a second IC that has bumps 312 that extend beyond an edge of a foreshortened side (see FIG. 13). With regard to alignment, edges 318 of the two chips are aligned such that portion 314 of bumps 312 from both ICs are exposed and extend beyond access plane 1—1, which is defined by two or more aligned edges 318 (see FIG. 3).

After alignment, the two chips are attached, such as by bonding major surface 310 of IC 306-1 to opposing major surface 1370 of IC 306-2. An adhesive (e.g., epoxy, etc.) is suitably used for attaching the chips together. A two-IC chip-stack results. Additional ICs can be attached, increasing the size of the chip-stack, as depicted in FIG. 3.

The exposed portion 314 of each bump 312 is available to form an electrical and mechanical connection to a second level electronics package (see FIG. 5).

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. An article comprising:
    a chip stack comprising a plurality of integrated circuit chips ("IC") that are disposed in spaced and parallel relation to one another, each said IC having two major surfaces, four sides, an active device area and a kerf surrounding said active device area, wherein:
        at least a portion of said kerf along one of said sides of each IC is removed defining a foreshortened side thereof;
        said foreshortened side of said ICs are aligned;
        a plurality of bumps are disposed along said foreshortened side between opposing major surfaces of adjacent ICs;
        each said bump is disposed partially in said active device area of said IC and partially beyond an edge of said foreshortened side.

2. The article of claim 1 further comprising a first plurality of bonding pads that are disposed on one of said opposing major surfaces of said adjacent ICs, wherein said plurality of bumps are disposed on said plurality of bonding pads.

3. The article of claim 2 wherein said bonding pads are electrically connected to electrical circuitry.

4. The article of claim 1 further comprising adhesive that is disposed in a space between said opposing major surfaces of said adjacent ICs.

5. The article of claim 4 wherein said adhesive is an epoxy.

6. The article of claim 1 wherein said chip stack defines a first level electronics package, and further comprising a second level electronics package, wherein said second level electronics package is attached to said first level electronics package at said bumps.

7. The article of claim 6 wherein said second level electronics package is a printed circuit board.

8. An article comprising:
   a plurality of integrated circuit ("IC") chips, each said IC chip having:
      electrical leads extending to one side thereof;
      bonding pads disposed at said one side, wherein said bonding pads are electrically connected to said electrical leads;
      bumps disposed on said bonding pads, wherein said bumps have an oblong shape and wherein an exposed portion of each of said bumps extends beyond said one side and beyond said bonding pads;
   wherein:
      said plurality of IC chips are secured to one another at major surfaces thereof forming a chip stack;
      said one side of each said IC chip is aligned with said one side of all other IC chips in said chip stack, said aligned sides defining an access plane;
      said exposed portion of each of said bumps extends beyond said access plane.

9. The article of claim 8 further comprising a substrate, said substrate having a plurality of electrically-conductive pads, wherein said exposed portion of said bumps is attached to said pads.

10. The article of claim 9 wherein said substrate comprises a printed circuit board.

* * * * *